US005659483A

United States Patent [19]

Rhodes et al.

[11] Patent Number: 5,659,483
[45] Date of Patent: Aug. 19, 1997

[54] SYSTEM AND METHOD FOR ANALYZING CONDUCTOR FORMATION PROCESSES

[75] Inventors: Ronald J. Rhodes, South Plainfield, N.J.; Timothy A. Estes, Albuquerque, N. Mex.

[73] Assignee: National Center for Manufacturing Sciences, Ann Arbor, Mich.

[21] Appl. No.: 678,805

[22] Filed: Jul. 12, 1996

[51] Int. Cl.$^6$ .................................................. G01R 27/04
[52] U.S. Cl. ........................... 364/481; 324/718; 378/22; 378/21; 364/490
[58] Field of Search ................... 427/96; 430/313; 324/718, 537, 719, 754, 538, 73.1, 149, 753, 757, 758; 364/578, 264, 490, 559; 378/21–22; 371/25.1; 356/385, 388; 29/759; 228/49.1

[56] References Cited

U.S. PATENT DOCUMENTS

| | | | |
|---|---|---|---|
| 3,763,409 | 10/1973 | Sheard | 317/258 |
| 3,851,228 | 11/1974 | Sheard | 317/258 |
| 3,930,809 | 1/1976 | Evans | 29/203 J |
| 3,963,986 | 6/1976 | Morton et al. | 324/158 |
| 4,196,386 | 4/1980 | Phelps | 324/73 |
| 4,269,515 | 5/1981 | Altman | 356/394 |
| 4,471,298 | 9/1984 | Frohlich | 324/73 PC |
| 4,520,314 | 5/1985 | Asch et al. | 324/158 |
| 4,771,230 | 9/1988 | Zeh | 324/73 |
| 4,796,259 | 1/1989 | Troy | 371/20 |
| 4,835,704 | 5/1989 | Eichelberger et al. | 364/490 |
| 4,906,194 | 3/1990 | Grabbe | 439/71 |
| 4,926,452 | 5/1990 | Baker et al. | 378/22 |
| 4,935,694 | 6/1990 | Clarridge | 324/158 F |
| 5,081,656 | 1/1992 | Baker et al. | 378/21 |
| 5,097,213 | 3/1992 | Hunting et al. | 324/538 |
| 5,097,492 | 3/1992 | Baker et al. | 378/22 |
| 5,171,161 | 12/1992 | Kachlic | 439/352 |
| 5,198,757 | 3/1993 | Azumai | 324/158 |
| 5,236,375 | 8/1993 | Kachlic | 439/607 |
| 5,329,471 | 7/1994 | Swoboda et al. | 364/578 |
| 5,367,253 | 11/1994 | Wood et al. | 324/158.1 |
| 5,502,390 | 3/1996 | Olsen | 324/537 |
| 5,506,510 | 4/1996 | Blumenau | 324/754 |
| 5,568,055 | 10/1996 | Olsen | 324/718 |

OTHER PUBLICATIONS

T.A. Estes, R.J. Rhodes, "An Electrical Test System for Conductor Formation Process Analysis," Apr. 1994.
T.A. Estes, R.J. Rhodes, "NCMS Imaging Team, Electrical Test System Design," Jan. 1995.

*Primary Examiner*—James P. Trammell
*Assistant Examiner*—Cuong H. Nguyen
*Attorney, Agent, or Firm*—Gifford, Krass, Groh, Sprinkle, Patmore, Anderson & Citkowski

[57] ABSTRACT

A centralized computer system in communication with a measurement system including a multi-point probe is programmed to analyze a plurality of conductor formations on a particular substrate, store information relating to an electrical characteristic of each conductor formation analyzed, and generate a report including information as to the variance in the electrical characteristic as a function of substrate position. To step through all of the conductor formations on a particular substrate, the computer may either be programmed to move a chuck holding the substrate under test relative to the points of the probe, or the system may include switching means disposed in an electrical path between the points of the probe and the resistance measurement system, enabling the computer to step through all of the conductor formations on a particular substrate by instructing the switching means to select points associated with only a single conductor formation for connection to the resistance measurement system. The system preferably further includes an imaging system interfaced to the chuck and computer to identify a visual target on the substrate and align the substrate relative to the points of the probe to ensure proper contact therebetween.

11 Claims, 5 Drawing Sheets

Test Patterns

Four Multi-pitch Modules

SYSTEM AND METHOD FOR ANALYZING CONDUCTOR FORMATION PROCESSES

FIELD OF THE INVENTION

This invention relates generally to printed circuits, printed wiring boards, electronic interconnect substrates, and the like, and, more particularly, to a system and methods to characterize, track and improve the materials, equipment and processes used to form the conductor patterns on such boards.

BACKGROUND OF THE INVENTION

Modern electronic circuitry is generally mounted onto printed-circuit boards (PCBs), also termed printed wiring boards (PWBs), using surface or through-hole techniques. Typically, copper patterns are formed on substrates by etching or plating techniques or used in multi-layer structures composed of stiffeners such as woven fiberglass and epoxy, although various alternative materials are also in use both for the conductors and dielectric supporting materials involved.

Due to the desire for higher levels of integration and functionality, such boards have, in some cases, become exceedingly complex, and may incorporate 20 layers or more with conductors and/or spaces of less than 5 mils, including buried and blind vias to facilitate connections between levels internal to the final sandwich-like structure.

As with many electronic assembly techniques, as difficult as it is to define and implement interconnect patterns, and so forth, it is even more difficult to repair circuits found to be substandard. Often PWBs with even minor problems are better off being discarded, resulting in a considerable loss to the manufacturer. Although open and short circuits may be easy to locate, more insidious problems occur when the conductor "nets" are properly defined, but, as a result of processing deficiencies, exhibit electrical characteristics, such as resistance, which are not within design specifications. Such problems may lead to boards which function properly for a while, then fail, or develop improper behavioral characteristics as a result of environmental conditions such as temperature and humidity variations.

Such properly-routed but out-of-specification electrical characteristics can be particularly difficult to analyze and resolve, not only because the circuits themselves and board patterns must be initially treated with suspicion in light of unusual or erratic behavior, but once products are shipped, failure analysis becomes much more difficult, and more expensive, since the process often involves dismantling of the equipment to facilitate debugging, and usually such tests are performed by individuals different from those who designed or built the subsystems, and may therefore be less familiar with it.

To further complicate matters, even if it is determined that the PWB is at fault, as opposed to other electrical connections, components or integrated circuits involved, many different pieces of processing equipment and fabrication steps are often involved in the conductor formation process, and each may need to be investigated in order to find the source of problems. For example, problems may lie with raw materials, the imaging systems used to expose the desired patterns, the photoresist used to transfer the image, the developing and etching equipment, and the chemicals used in the equipment, and so forth.

The industry will surely benefit, then, from a system and/or techniques useful in characterizing conductor formation processes, whether for printed circuit or wiring boards, multi-chip modules, flat-panel displays or other applications, thereby enabling a manufacturer to know, in advance, where potential problems lie, further allowing such problems to be tracked down and corrected prior to final product assembly.

SUMMARY OF THE INVENTION

The present invention provides a system and methods associated therewith for analyzing conductor patterns on a substrate. Though ideally suited to printed wiring boards, and the like, the principles disclosed herein are applicable to any electronic interconnection system capable of being probed in order to acquire information regarding an electrical characteristic of the conductors involved.

The system includes a chuck for holding one or more substrates in a test position. A probe having multiple points contacts the conductor pattern(s) on a particular substrate, and a measurement system connected to the points of the probe is used to determine an electrical characteristic of the pattern involved. Preferably a centralized computer system in communication with the measurement system is programmed to analyze a plurality of patterns on a particular substrate, store information relating to an electrical characteristic of each pattern analyzed, and generates a report including information as to the variance in the electrical characteristic as a function of substrate position. In the preferred embodiment, the electrical characteristic measured is resistance.

To step through all of the conductor formations on a particular substrate, the computer may be programmed to move the chuck holding the substrate under test relative to the points of the probe. Alternatively, the system may include switching means disposed in an electrical path between the points of the probe and the resistance measurement system, enabling the computer to step through all of the conductor formations on a particular substrate by instructing the switching means to select points associated with only a single conductor formation for connection to the resistance measurement system.

The system preferably further includes an imaging system interfaced to the chuck and computer to identify a visual target on the substrate and align the substrate relative to the points of the probe to ensure proper contact of the probe points and pads associated with a particular pattern.

A method of analyzing electrical conductor formation in accordance with the invention comprising the steps of providing a plurality of electrically conductive test patterns across a surface area of a substrate, each pattern including contact pads suitable to a probe-type resistance measurement; probing each pattern to acquire an electrical characteristics associated therewith, preferably electrical resistance; storing data representative of the electrical characteristics acquired through the step of probing each pattern; and generating a report based on the stored data which relates to substrate position.

The invention also claims a substrate adapted for testing within an automated conductor formation analysis system constructed according to the invention, the substrate including an array of modules, each containing a plurality of conductors forming a serpentine-shaped pattern covering the module area, each pattern including contact pads suitable to a probe-type resistance measurement.

In alternative embodiments of the substrate adapted for testing, the serpentine-shaped pattern may comprise conductor lines and spaces according to one or more of the following pattern designs:

a) a single-pitch pattern having fixed line and space widths, b) a multi-space pattern having variable space widths and fixed line widths, c) a multi-line pattern having variable line widths and fixed space widths, and d) a multi-pitch pattern having variable line and space widths.

BRIEF DESCRIPTION OF THE PREFERRED EMBODIMENT

DETAILED DESCRIPTION OF THE INVENTION

The present invention provides a set of hardware and software tools used to characterize conductor formation processes for a variety of applications, including printed wiring boards, multi-chip modules, flat-panel displays, and any other type of conductor patterns used in conjunction with electronics-related substrates, or any conductive patterns formed on substrates unrelated to electronics. By way of introduction, this detailed description will first explain the various hardware systems involved, then the focus will turn to a software overview. From there, preferred test patterns will be introduced and discussed, and examples of reports generated in graphical form will be described. Information gained from the system includes conductor cross sectional area, width and height uniformity, conductor and space defect density, and a multitude of other important and useful characteristics. When combined with designed experiments, such tools should provide manufacturers as well as suppliers of materials and equipment to the electronics manufacturing industry, the capability to improve products and profitability before serious problems arise.

Figure 1:
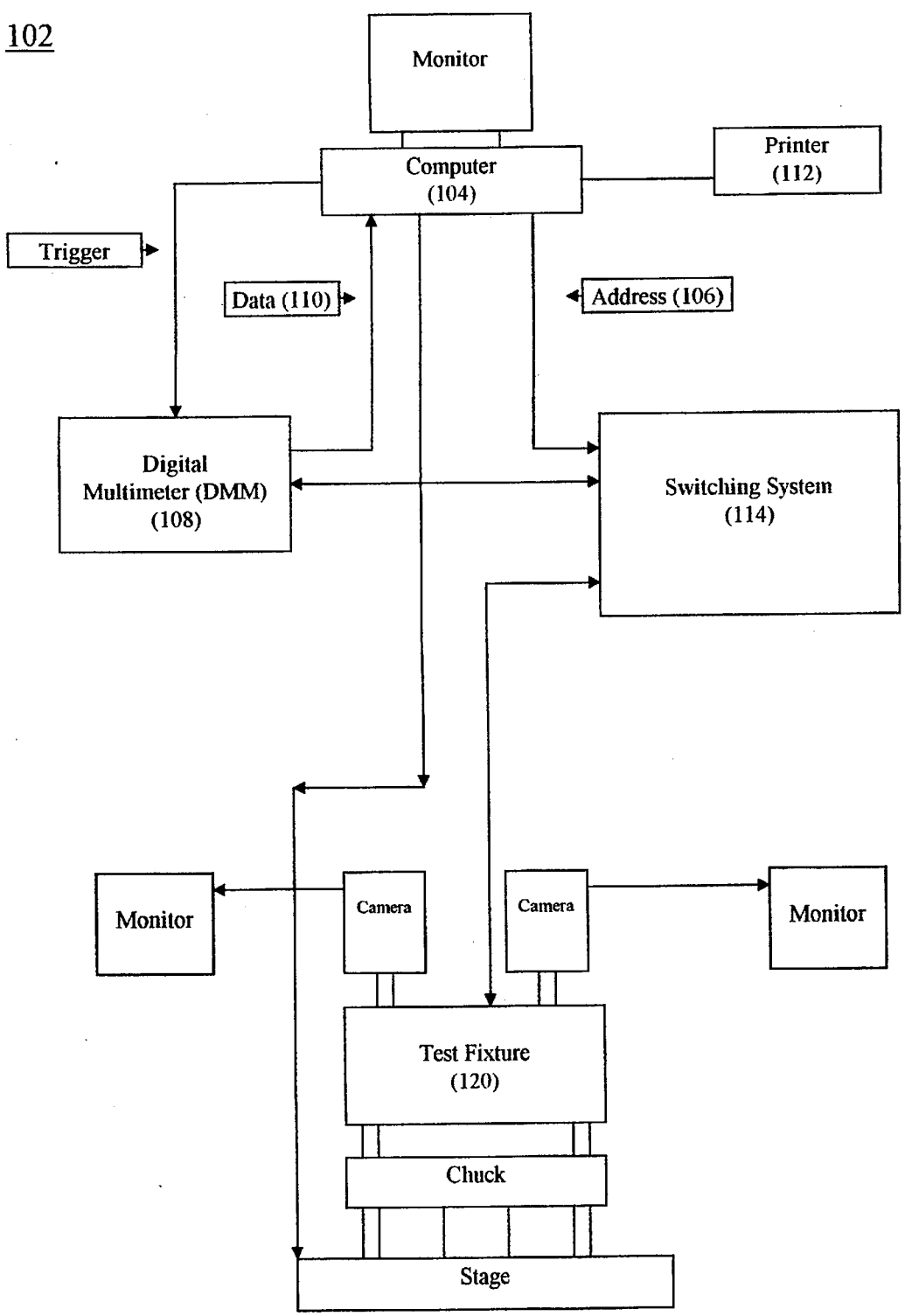
FIG. 1 is a block diagram of an electrical test system according to this invention for conductor formation process analysis.

Making reference to FIG. 1, there is shown a block diagram which illustrates generally at 102 major hardware subsystems interconnected in accordance with the invention. A computer 104, preferably a DOS/windows-based machine with a 486 or higher-performance CPU is programmed with software, described in greater detail below, to control the addressing of the specific conductors to be tested over a parallel address bus 106. The computer 104 is also programmed to automatically trigger a digital multimeter 108, and record resistance data obtained therefrom over path 110, preferably compliant with the IEEE 488 bus structure. The digital multimeter 108 is preferably an HP 3458A multimeter or equivalent. The system also incorporates a laser printer 112 connected to the computer 104 used to generate analysis results in report form.

A digital switching system 114 is used to decode the parallel address bus 106 to connect the multimeter 108 in a four-wire resistance mode to the specific conductors under test. The system 114 may be based upon various technologies depending upon target performance requirements, though, in the preferred embodiment, high-speed solid-state (i.e., MOSFET) switches are used.

A test fixture 120 broadly consists of a pneumatic stage and vacuum platen to hold and translate the board under test, a bed-of-nails test head used in mechanical conjunction with the pneumatic stage and vacuum platen, and a camera system for registration. The vacuum system may use any type of available vacuum chuck adequate to hold a panel under test in position, though the test head itself preferably comprises double-ended spring probes having pins pressed into a rigid insulating hop plate, with all pins on grid to within ±0.005 inches, facilitating greater than 50 percent pin travel on all pins during a particular test. Although commercially available two- or four-probe test heads may be used in accordance with the invention, they typically are limited in terms of speed and precision. Therefore, in the preferred embodiment, a "bed-of-nails" system is used for superior performance and lower overall operating costs.

More specifically, the test head consists of 24"×30" G-10 epoxy-glass plates. Double ended spring-probes are press-fit into holes in the plate located over the corresponding test pattern pad locations, depicted in FIG. 3. The G-10 plates and a multilayer printed wiring board is fastened via 88 screws. When seated properly, the spring-probes compress so they make contact to the corresponding connectors in the PWB. The opposite ends of the double-ended probes contact the test pattern panel when the pneumatic stage is in the closed (up) position. The epoxy glass plate is supported on four steel rods that are fastened to the G-10 plates and the supporting table.

The stage is mounted to the four steel rods via bearings and is controlled by pneumatic valves. The stage movement is powered by a pneumatic cylinder. The stage travel, and thus the pin-probe travel is controlled by air pressure to the cylinder. One-hundred psi supply air passes through an air pressure regulator, a toggle valve, and an interlock valve to the cylinder. Vacuum is derived from the same 100-psi air supply, and an air pressure regulator and toggle valve provide air to a venturi. When the air valve is opened, the air is passed through a venturi, creating a vacuum to hold the panel in place. Closing the air valve stops the vacuum and vents the vacuum line, thus releasing the panel.

The optical registration system includes two camera systems with two solid-state black-and-white monitors, used in conjunction with a manual positioning operation. The two cameras are mounted in holes in the test head; one at the lower left corner of the panel, and the other at the upper right corner of the panel. Targets placed on the aluminum vacuum chuck are used to establish the reference position on the camera monitors. The panel is loaded and moved by hand until the targets on the panel coincide with the reference position on the computer monitor. Then the vacuum is applied to hold the panel in position. Other aspects of the system-level characteristics of the hardware include various cables used from computer to test head and from test head to monitor, as well as appropriate power supplies and compressed air to power the pneumatic cylinder and drive the pneumatic vacuum system in the chuck.

Figure 2:
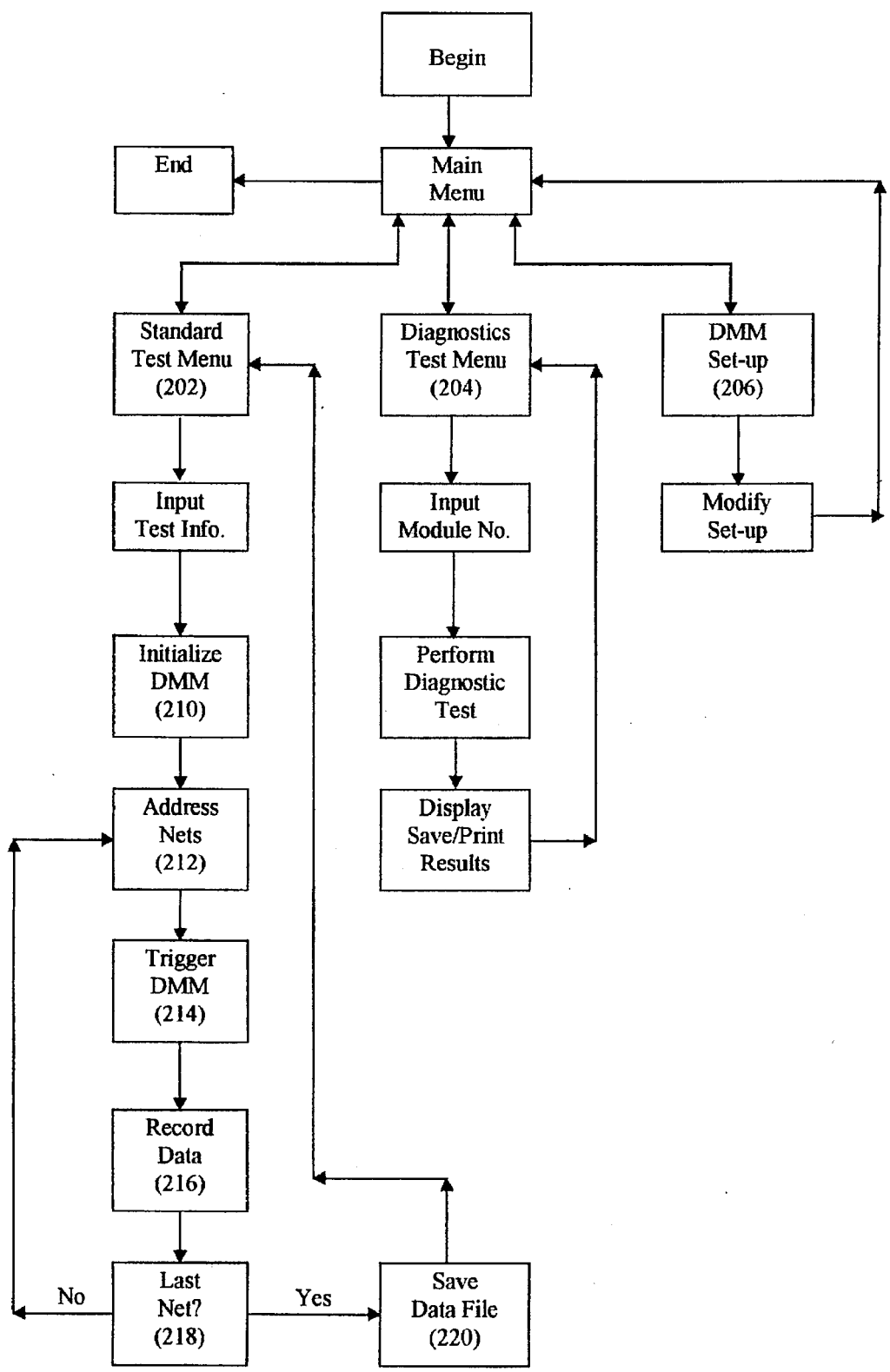
FIG. 2 is a flow chart used to illustrate major software steps according to a method aspect of the invention.

Now making reference to FIG. 2, major software modules according to the invention are shown in flowchart form. The software interface is menu-driven with main menu options allowing the operator to perform a standard test (202), a diagnostics test of the system electronics (204), or to set-up the digital multimeter (206).

The diagnostics menu (204) allows the operator to select any module, perform a repeatability test on that module, and display, print, or save the results to an ASCII file. The multimeter has a default setup which can be modified by the operator, if desired.

The standard test (202) is used to test an entire panel side. The test system reads a pattern ID code printed on the panel to identify the panel size, the panel side under test, the pattern type and particular design. The operator inputs information about the panel, the experiment which was performed, and where the data is to be stored. This information is recorded in the first line of each data file. Then the panel is tested, the data saved to disk, and the operator is presented with the standard test menu again. The data is saved in an ASCII data file.

With further regards to the standard test, at step 210, the digital multimeter 108 electrically connected to the test head and computer is initialized and, at step 212, a first net or set of nets is addressed. After an appropriate settling time, the multimeter is triggered at step 214 and data are recorded at step 216 in conjunction with the net addressed at step 212. At step 218 an inquiry is made as to the whether the net just tested was the last. If not, the process continues in loop fashion until the last net is addressed and recorded, at which point a data file is saved at step 220, and is used as the basis for output reporting.

Figure 3:
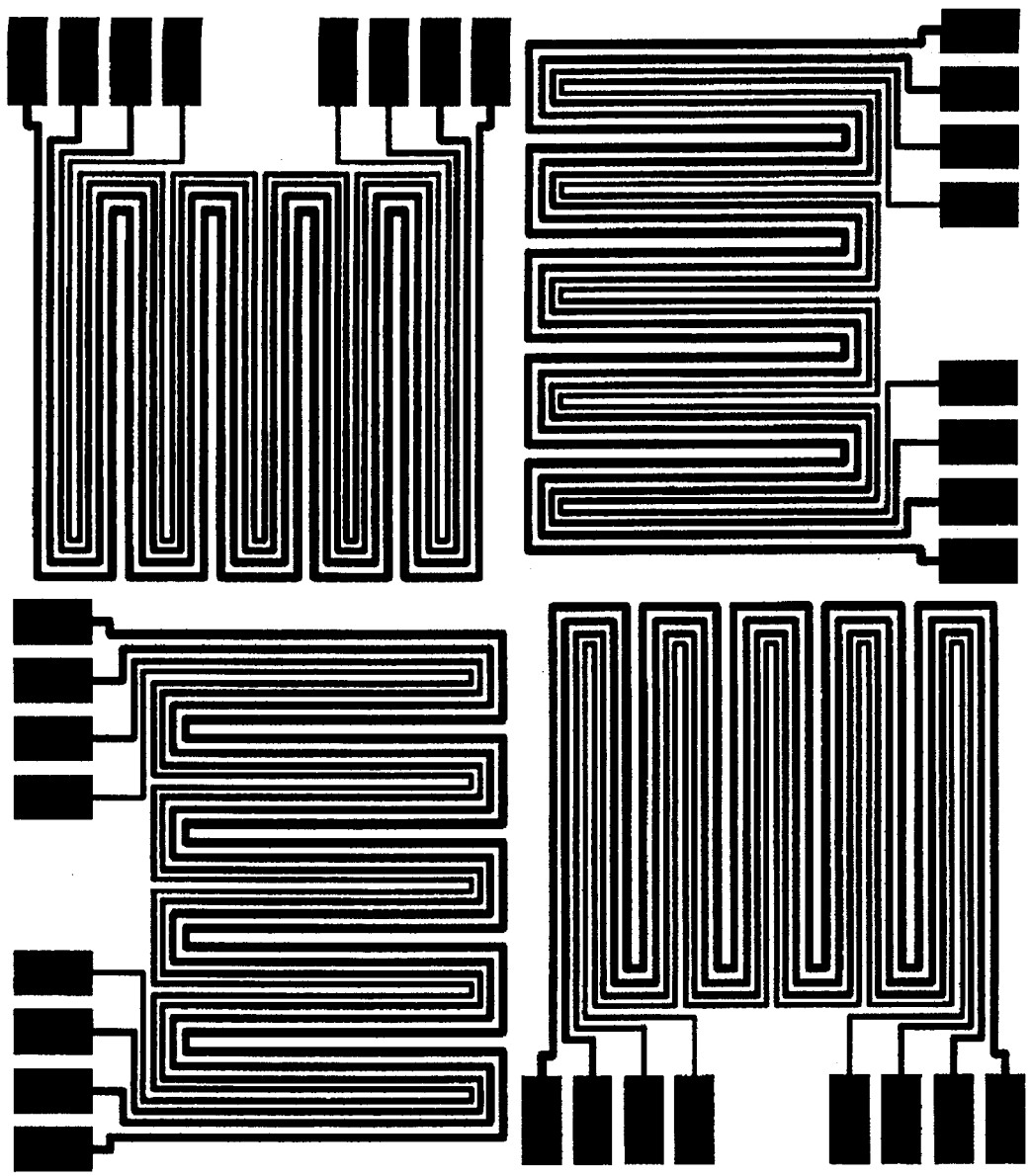
FIG. 3 is a graphical representation of a test pattern useful with the invention, in this case a pattern containing four multi-pitch modules.
Figure 4:
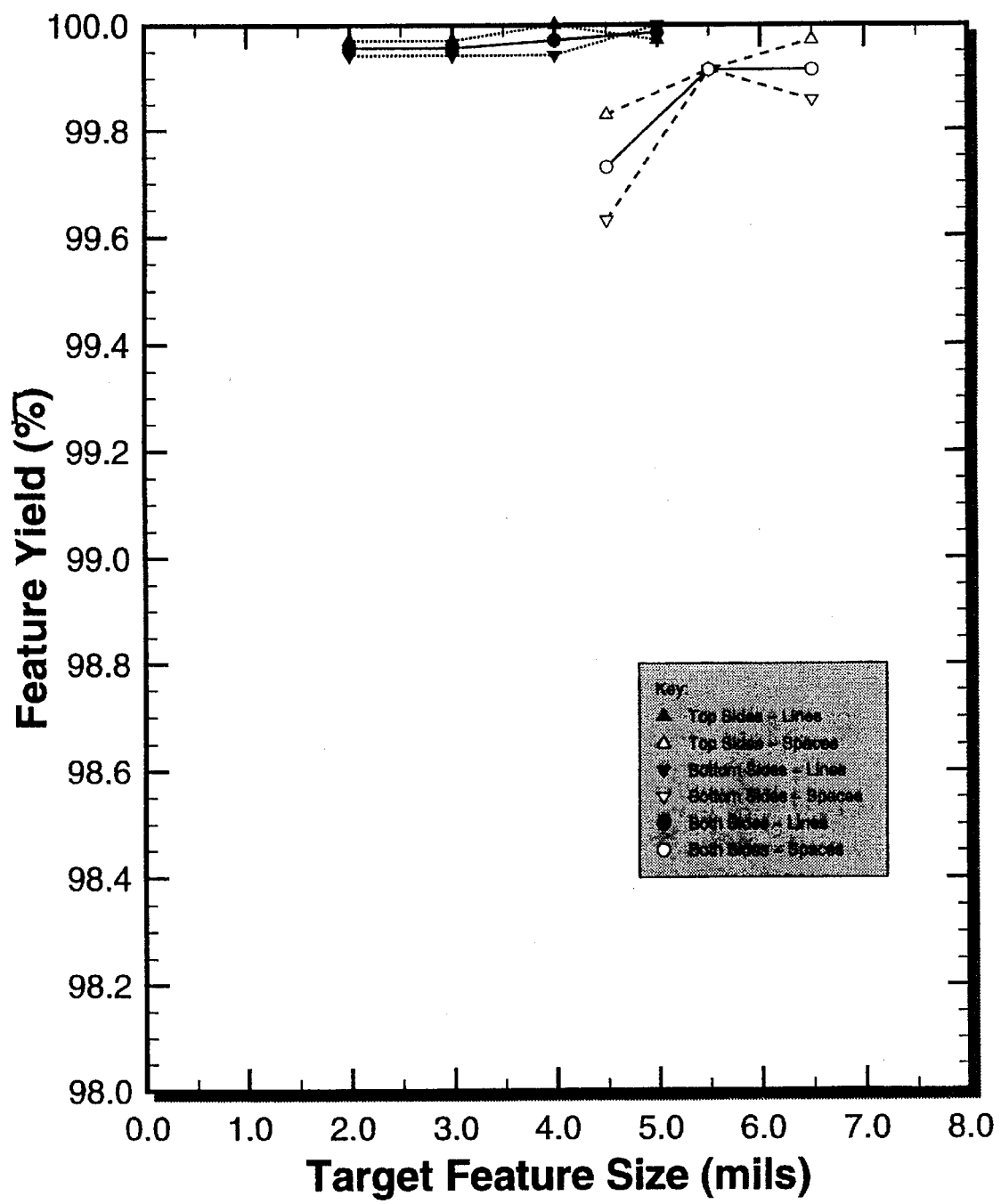
FIG. 4 is a drawing of one form of report generated by a system built in accordance with the invention, in this case conductor and space yield by target feature size.
Figure 5:
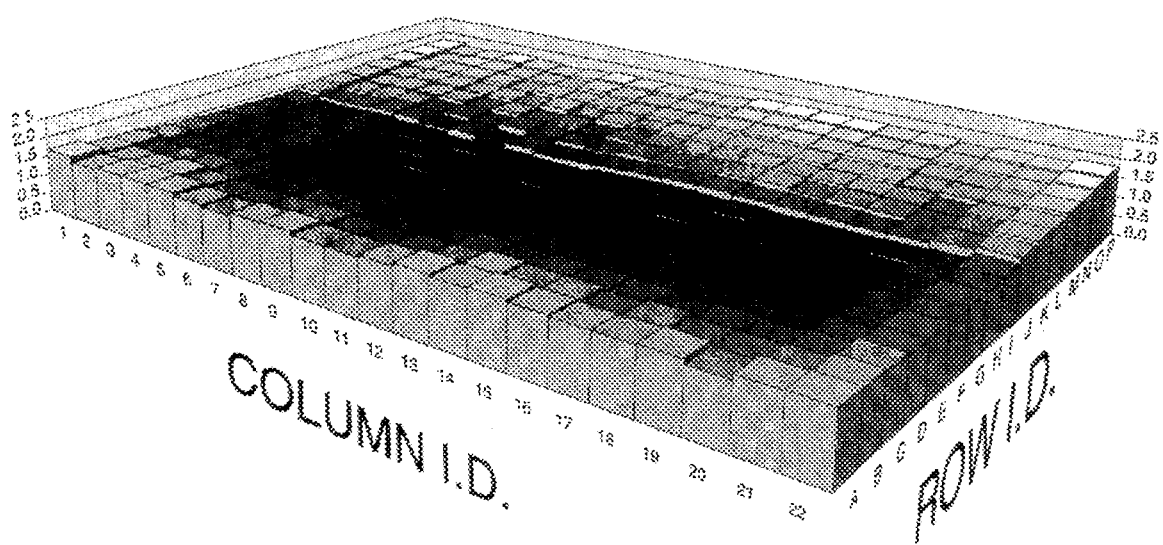
FIG. 5 is another form of report generated by the invention, this being conductor width loss for the top sides averaged over ten 18×24 inch panels.

As shown in FIG. 3, test patterns are composed of one-inch-square modules arrayed over the panel surface area. Each test pattern is preferably available in each of four types: single-pitch; multi-space; multi-line; and multi-pitch. Each of these test patterns can be made on four standard panel sizes: 18" by 24", 12" by 18", 14" by 14", and 12" by 12". The single-pitch pattern contains conductors and spaces of a single width, each independently selected from ¼-mil to 8-mils in ¼-mil increments.

The multi-space pattern contains conductors of a single width, selected from ½-mil to 8-mils in ½-mil increments and spaces of varying widths. The smallest space width is selected from ½-mil to 8-mils in ½-mil increments. Subsequent space widths in the pattern increase by ½, 1, 1½, or 2-mils.

The multi-line pattern contains spaces of a single width, selected from ½-mil to 8-mils in ½-mil increments and conductors of varying widths. The smallest conductor width is selected from ½-mil to 8-mils in ½-mil increments. Subsequent conductor widths in the pattern increase by ½, 1, 1½, or 2-mils.

The multi-pitch pattern contains conductors and spaces that vary in width. Starting conductor and space widths are selected independently from ½-mil to 8-mils in ½-mil increments. The increment in both the conductor and the space widths is either ½, 1, 1½, or 2-mils.

Substrate positioning is characterized on the basis of rows and columns. Rows are counted from the near edge of the panel to the far edge, as positioned in the tester. Columns are counted from the left edge to the right edge for the top side of the panels, and from the right edge to the left edge for the bottom side of the panels. Thus modules are denoted [r, c] and for an 18×24 inch panel, module [1,1] is at the near-left corner of the tester, and module [16,22] is located at the far-right corner of the tester for the top sides, while module [1,1] is at the near-right corner and module [16,22] is at the far-left corner for the bottom side. The software preferably addresses odd-numbered rows (1,3,5 ... 15) and each of the 22 columns. The net decode electronics uses this information to address the row ($r_i$) and row+1 ($r_{i+1}$) at column ($c_j$).

In terms of system performance, the time for a resistance reading takes into account address initiation, switching system stabilization, the actual resistance measurement, data transfer and data storage. Initial tests of the system have determined an average total value of approximately 150 milliseconds. Total cycle time includes the time required for loading, registration, fixture closure and unloading of the panel under test. Total cycle time values on the order of 2 to 5 minutes are achievable, depending upon pattern density, probe type and other considerations.

The accuracy of the system was compared against hand 4-wire resistance measurements using a conventional multimeter and test substrate. Of primary interest was the effect the switching system had on the accuracy of the readings. Aside from the change in resistivity of the conductor material as a function of temperature, it was determined that the switching system exhibited no effect on the accuracy of the test system. Measurements were also undertaken in an effort to determine the repeatability of the test system. Such measurements involved performing 10 tests in succession on the same test substrate and calculating the variation in the measurements, assuming the conductors on the test pattern are not varying in resistance during the span of the 10 tests. Thus, any variation in conductor resistance measurements would be due to the test method itself. Based upon these criteria, a standard deviation independent of conductor width, was found to be less than 0.003 ohms for all conductor widths.

The invention therefore provides a system and methods to quickly, accurately, and precisely measure the resistance of conductors formed on PWB substrates and thus, to measure conductor formation capability. The data obtained from these measurements allows the determination of conductor cross sectional area, width and height uniformity, defect density, and other useful characteristics. With this capability, printed wiring board manufacturers, as well as suppliers of materials and equipment to the PWB industry, may be provided with the capability to improve their products and their profitability. Conductor formation processes can be optimized for both conductor yield and uniformity, and process equipment can be fine-tuned prior to final product processing to ensure that conductor attributes fulfill requirements.

Having described my invention, I claim:

1. A system for analyzing conductor formations on a substrate, comprising:

a chuck for holding one or more such substrates in a test position;

a probe having multiple points for contacting the conductor formations on a particular substrate;

an electrical measurement system connected to the points of the probe for determining an electrical characteristic of a particular conductor formation under test; and a computer in communication with the electrical measurement system, the computer including data storage means and being programmed to perform the following functions:

analyze a plurality of the conductor formations on a particular substrate, store information relating to the characteristics of each conductor formation analyzed, and generate a report including information as to the variance in electrical characteristics of the conductor formations across the area of the substrate including the analyzed conductor formations.

2. The system of claim 1, wherein the electrical characteristic is resistance.

3. The system of claim 1, wherein the points of the probe are configured to make contact to a single conductor formation at a time, the computer being programmed to advance through all of the conductor formations on a particular substrate by moving the chuck holding the substrate under test relative to the points of the probe.

4. The system of claim 1, wherein the points of the probe are capable of making simultaneous contact to a plurality of conductor formations, the system further including switching means disposed in an electrical path between the points of the probe and the resistance measurement system, the computer being programmed to advance through all of the conductor formations on a particular substrate by instructing the switching means to select points associated with only a single conductor formation for connection to the resistance measurement system.

5. The system in claim 4 wherein the computer is programmed to advance through all of the conductor formations on a particular substrate by instructing the switching means to select points associated with two adjacent conductors within the plurality of conductors within a module.

6. The system of claim 1, further including an imaging system interfaced to the chuck and computer to identify a visual target on the substrate and align the substrate relative to the points of the probe to ensure proper contact therebetween.

7. A method of analyzing electrical conductor formation, comprising the steps of:

providing a plurality of electrically conductive test patterns across a surface area of a substrate, each pattern including contact pads suitable to a probe-type resistance measurement;

probing each pattern to acquire an electrical characteristic associated therewith;

storing data representative of the electrical characteristics acquired through the step of probing each pattern; and generating a report based on the stored data which is related to substrate position.

8. The method of claim 7, including resistance as an electrical characteristic.

9. The method of claim 7, including the step of providing the electrically conductive test patterns as an array of modules, each module containing a plurality of conductors forming a serpentine-shaped pattern covering the module area.

10. A substrate adapted for an automated conductor formation analysis, comprising:

array of modules provided on the substrate, each module containing a plurality of conductors forming a serpentine-shaped pattern covering the module area, each pattern including contact pads suitable to a probe-type resistance measurement.

11. The substrate of claim 10, wherein the serpentine-shaped pattern comprises conductor lines and spaces therebetween in accordance with one or more of the following pattern designs:

a) a single-pitch pattern having fixed conductor and space widths, b) a multi-space pattern having variable space widths and fixed conductor widths, c) a multi-line pattern having variable conductor widths and fixed space widths, and d) a multi-pitch pattern having variable conductor and space widths.

* * * * *

UNITED STATES PATENT AND TRADEMARK OFFICE
CERTIFICATE OF CORRECTION

PATENT NO. : 5,659,483
DATED      : August 19, 1997
INVENTOR(S): Rhodes et al

It is certified that error appears in the above-indentified patent and that said Letters Patent is hereby corrected as shown below:

Column 1, line 34: Replace "Short" with --short--.

Column 5, line 11: Replace "snored" with --stored--.

Column 5, line 67: Replace "$(r_{1+1})$" with --$(r_{i+1})$--.

Signed and Sealed this

Seventeenth Day of February, 1998

Attest:

BRUCE LEHMAN

Attesting Officer

Commissioner of Patents and Trademarks